United States Patent
Chen et al.

(10) Patent No.: US 9,698,185 B2
(45) Date of Patent: Jul. 4, 2017

(54) PARTIAL BURIED CHANNEL TRANSFER DEVICE FOR IMAGE SENSORS

(75) Inventors: Gang Chen, San Jose, CA (US); Sing-Chung Hu, San Jose, CA (US); Hsin-Chih Tai, San Jose, CA (US); Duli Mao, Sunnyvale, CA (US); Manoj Bikumandla, San Jose, CA (US); Wei Zheng, Los Gatos, CA (US); Yin Qian, Milpitas, CA (US); Zhibin Xiong, Santa Clara, CA (US); Vincent Venezia, Los Gatos, CA (US); Keh-Chiang Ku, Cupertino, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1535 days.

(21) Appl. No.: 13/273,026

(22) Filed: Oct. 13, 2011

(65) Prior Publication Data

US 2013/0092982 A1 Apr. 18, 2013

(51) Int. Cl.
*H01L 27/148* (2006.01)
*H01L 31/062* (2012.01)
(Continued)

(52) U.S. Cl.
CPC .. *H01L 27/14616* (2013.01); *H01L 27/14689* (2013.01)

(58) Field of Classification Search
CPC ......... H01L 27/14603; H01L 27/14609; H01L 27/14616
See application file for complete search history.

(56) References Cited

U.S. PATENT DOCUMENTS

2006/0118835 A1 6/2006 Ellis-Monaghan et al.
2007/0262355 A1 11/2007 Palsule et al.
(Continued)

FOREIGN PATENT DOCUMENTS

CN 1300098 A 6/2001
CN 1917225 A 2/2007
(Continued)

OTHER PUBLICATIONS

EP 12187793.0—Extended European Search Report, dated Oct. 4, 2013 (10 pages).
Komaragiri, R. et al., "Depletion-Free Poly Gate Electrode Architecture for Sub 100 Nanometer CMOS Devices with High-K Gate Dielectrics", pp. 108-112.
(Continued)

*Primary Examiner* — Raj R Gupta
(74) *Attorney, Agent, or Firm* — Blakely Sokoloff Taylor & Zafman LLP

(57) ABSTRACT

Embodiments of an image sensor pixel that includes a photosensitive element, a floating diffusion region, and a transfer device. The photosensitive element is disposed in a substrate layer for accumulating an image charge in response to light. The floating diffusion region is dispose in the substrate layer to receive the image charge from the photosensitive element. The transfer device is disposed between the photosensitive element and the floating diffusion region to selectively transfer the image charge from the photosensitive element to the floating diffusion region. The transfer device includes a buried channel device including a buried channel gate disposed over a buried channel dopant region. The transfer device also includes a surface channel device including a surface channel gate disposed over a surface channel region. The surface channel device is in series with the buried channel device. The surface channel gate has the opposite polarity of the buried channel gate.

16 Claims, 7 Drawing Sheets

(51) Int. Cl.
*H01L 31/101* (2006.01)
*H01L 31/113* (2006.01)
*H01L 27/146* (2006.01)

(56) References Cited

U.S. PATENT DOCUMENTS

| | | | |
|---|---|---|---|
| 2008/0128767 A1* | 6/2008 | Adkisson et al. | 257/292 |
| 2008/0179639 A1* | 7/2008 | Gambino et al. | 257/291 |
| 2009/0035886 A1 | 2/2009 | Ellis-Monaghan et al. | |
| 2009/0179232 A1 | 7/2009 | Adkisson et al. | |
| 2010/0276574 A1 | 11/2010 | Manabe | |
| 2010/0314667 A1 | 12/2010 | Nozaki et al. | |
| 2011/0032405 A1 | 2/2011 | Nozaki et al. | |
| 2011/0109752 A1 | 5/2011 | Lee | |

FOREIGN PATENT DOCUMENTS

| | | |
|---|---|---|
| TW | 200837941 A | 9/2008 |
| TW | 201123860 A | 7/2011 |
| WO | WO 2005/096384 A1 | 10/2005 |

OTHER PUBLICATIONS

TW Patent Application No. 101137818—Taiwanese Office Action and Search Report, with English Translation, issued Jul. 15, 2014 (13 pages).
CN Patent Application No. 201210385836.9—Chinese Office Action and Search Report, with English Translation, issued Nov. 4, 2014 (17 pages).
TW Patent Application No. 101137818—Taiwanese Office Action, with English Translation, issued Mar. 23, 2015 (9 pages).
TW Patent Application No. 101137818—Taiwanese Office Action and Search Report, with English Translation, issued Oct. 13, 2016 (8 pages).
TW Patent Application No. 101137818—Taiwanese Office Action and Search Report, with English Translation, issued May 9, 2016 (14 pages).
CN Patent Application No. 201210385836.9—Chinese Office Action, with English Translation, issued Jul. 17, 2015 (13 pages).
EP Patent Application No. 12187793.0—European Office Action, dated Jan. 12, 2017 (6 pages).

* cited by examiner

PARTIAL BURIED CHANNEL TRANSFER DEVICE FOR IMAGE SENSORS

TECHNICAL FIELD

This disclosure relates generally to optics, and in particular but not exclusively, relates to image sensors.

BACKGROUND INFORMATION

Image sensors are widely used in digital still cameras, cellular phones, security cameras, as well as in, medical, automobile, and other applications. Complementary metal-oxide-semiconductor ("CMOS") technology is used to manufacture lower cost image sensors on silicon substrates. In a large number of image sensors, the image sensor commonly includes hundreds, thousand or even millions of light sensor cells or pixels. A typical individual pixel includes a micro-lens, a filter, a photosensitive element, a floating diffusion region, and one or more transistors for reading out a signal from the photosensitive element. One of the transistors included in the typical pixel is commonly referred to as a transfer transistor, which includes a transfer gate disposed between the photosensitive element and the floating diffusion. The transfer gate is disposed on a gate oxide. The photosensitive element, floating diffusion region, and gate oxide are disposed on a substrate.

During operation of a typical pixel, a conducting channel region may be formed under the transfer gate when a bias voltage is applied to the transfer gate such that an image charge is transferred from the photosensitive element to the floating diffusion region. However, conventional pixels often suffer from image lag, blooming, and manufacturing challenges.

Image lag may result from the conventional transfer transistor being unable to remove all the signal from the photosensitive element such that a residual signal remains during successive readings of the pixel. This leftover information remaining in the photosensitive element is often referred to as image lag, residual image, ghosting or frame-to-frame retention.

Blooming may result from high intensity portions of an image which cause photo-generated excess charge carriers to spill into adjacent photosensitive elements. Blooming may limit the imaging sensor's dynamic range and may limit the types of commercial applications of the imaging sensor.

Manufacturing challenges in the conventional pixel may stem from the position-sensitive placement of the photosensitive element in relation to the transfer gate. The sensitive nature of the placement may result in increased defects in parts and increased manufacturing costs.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus, system, and method of manufacture for an image sensor with a partial buried channel transfer gate are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
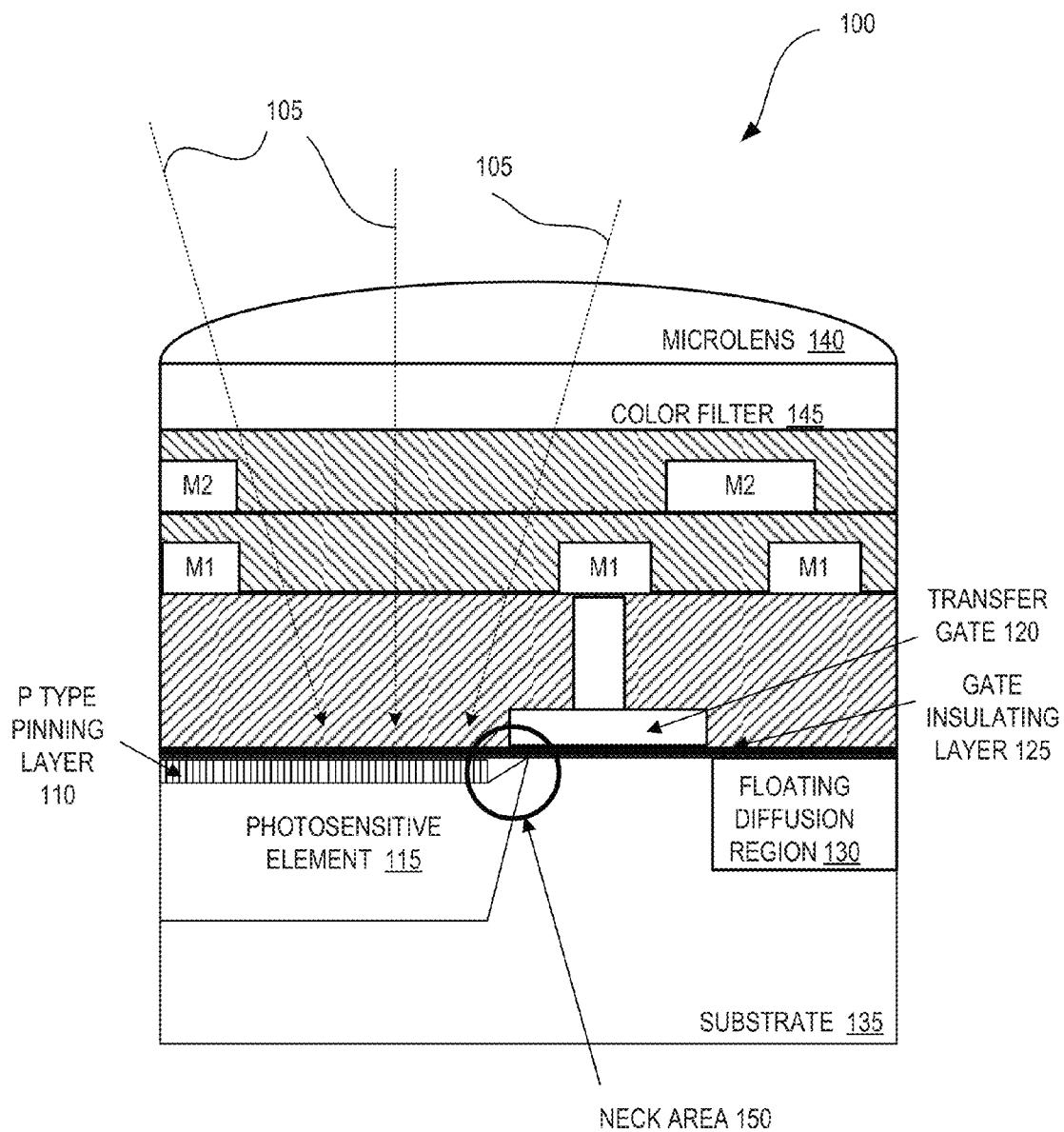
FIG. 1 is a cross sectional view of a conventional image sensor pixel including a conventional transfer gate structure and a conventional photosensitive element structure.

FIG. 1 is a cross sectional view of a conventional image sensor pixel including a conventional transfer gate structure and a conventional photosensitive element structure. An image pixel 100 includes a photosensitive element 115 that receives light 105 that is incident on image pixel 100. To implement a color pixel, image pixel 100 further includes a color filter 145 disposed under a microlens 140. Microlens 140 aids in focusing light 105 onto photosensitive element 115. Generally, an image sensor includes many image pixels 100 arranged in an array of two dimensional rows and columns in a larger substrate (i.e., extending beyond substrate 135 as shown). Image pixel 100 further includes a floating diffusion ("FD") region 130 and photosensitive element 115 (e.g. photodiode) disposed on substrate 135. Substrate 135 may include an epitaxial layer grown on a substrate. Transfer gate 120 is disposed between photosensitive element 115 and FD region 130 and is used to transfer the signal output from photosensitive element 115 to FD region 130. A conducting channel (not illustrated) may be formed in substrate 135 under transfer gate 120 and under gate insulating layer 125 when a threshold gate voltage (i.e. bias voltage) is applied to it. A P type pinning layer 110 may be disposed over photosensitive element 115. Neck area 150 is a region that includes the intersection of P type pinning layer 110, photosensitive element 115, transfer gate 120, and substrate 135.

Pixel 100 operates as follows. During an integration period (also referred to as an exposure or accumulation period), light 105 is incident on photosensitive element 115. Photosensitive element 115 generates an electrical signal (photo-generated charge) in response to the incident light. The electrical signal is held in photosensitive element 115. At this stage, transfer gate 120 may be off. The bias voltage to turn on transfer gate 120 may be a negative voltage. When the bias voltage on transfer gate 120 is less than its threshold voltage, transfer gate 120 is off and the substrate between photosensitive element 115 and FD region 130 is resistant to electron flow.

After the integration period, transfer gate 120 is turned on to read out the signal from photosensitive element 115. For example, a positive bias voltage is applied to transfer gate 120 and when the bias voltage on transfer gate 120 is increased, the substrate below transfer gate 120 near floating diffusion region 130 first becomes conductive. The substrate below transfer gate 120 that becomes conductive when a bias voltage is applied to transfer gate 120 is called the channel region (not illustrated). The channel region continues to gradually become conductive toward photosensitive element 115 as the threshold voltage is approached. When the threshold voltage is met, the channel region is conductive allowing charge carriers to flow between photosensitive element 115 and FD region 130, thus transferring the electrical signal held by photosensitive element 115 to FD region 130. After the electrical signal in photosensitive element 115 has been transferred to floating diffusion region 135, transfer gate 120 is turned off in anticipation of the next integration period.

Figure 2:
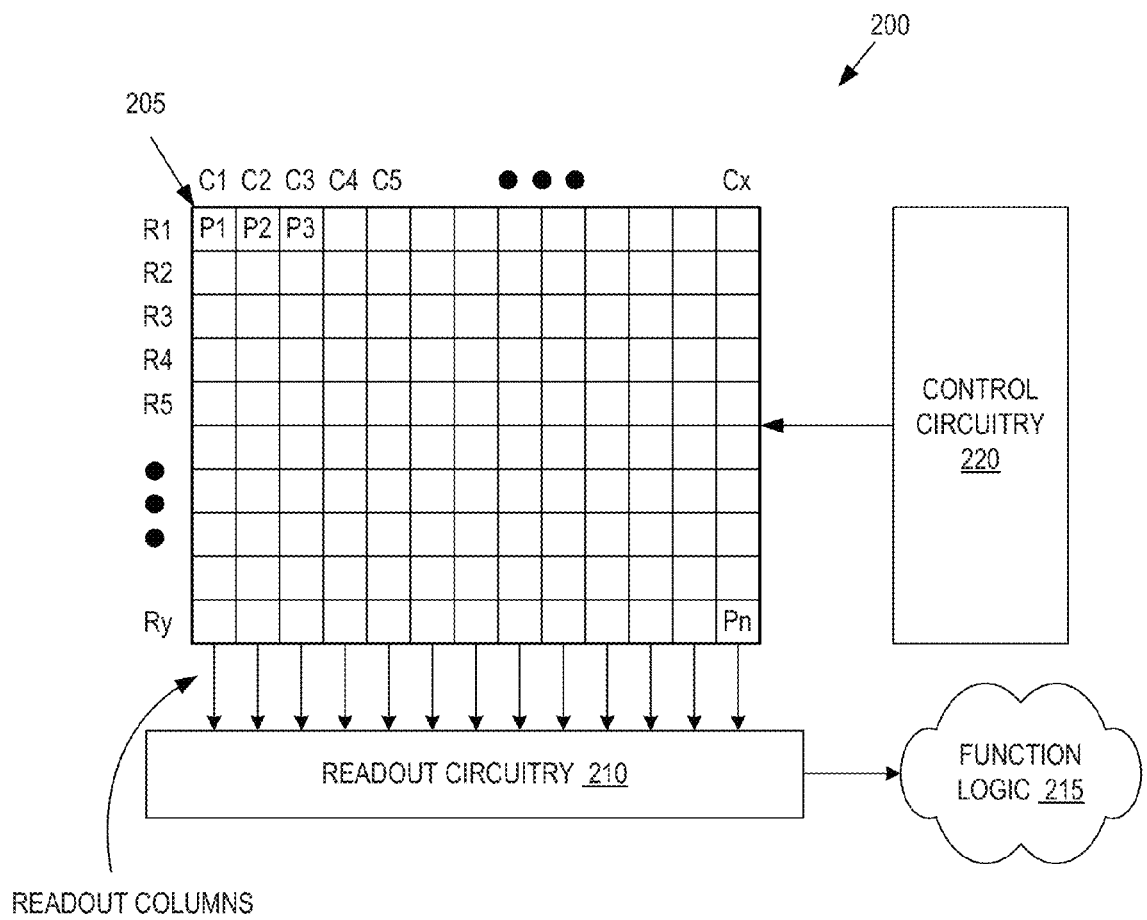
FIG. 2 is a functional block diagram illustrating an image sensor, in accordance with an embodiment of the disclosure.

FIG. 2 is a block diagram illustrating an imaging system 200, in accordance with an embodiment of the disclosure. The illustrated embodiment of imaging system 200 includes a pixel array 205, readout circuitry 210, function logic 215, and control circuitry 220.

Pixel array 205 is a two-dimensional ("2D") array of imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a serial readout or a full parallel readout of all pixels simultaneously. Control circuitry 220 is coupled to pixel array 205 to control operational characteristic of pixel array 205. For example, control circuitry 220 may generate a shutter signal for controlling image acquisition.

Figure 3:
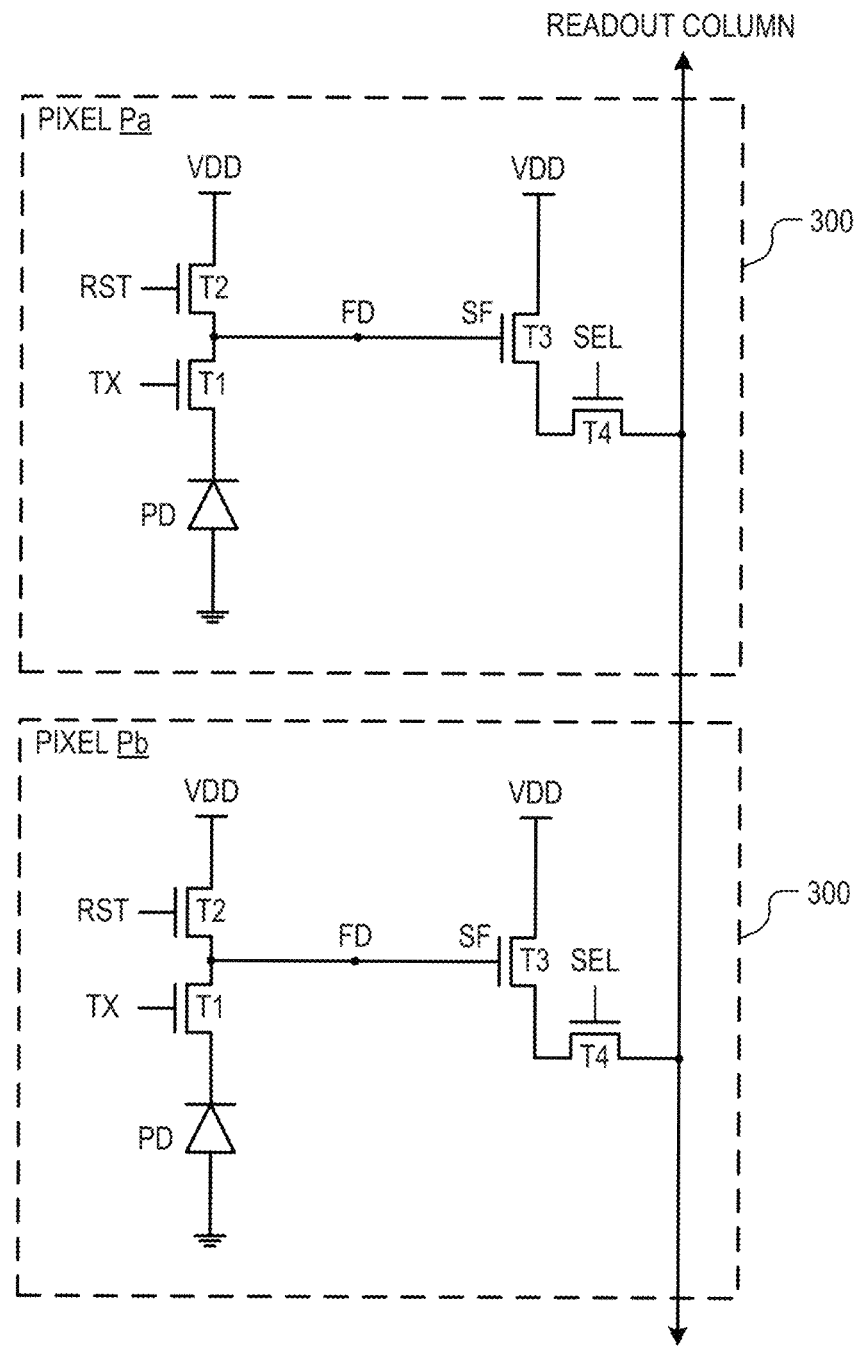
FIG. 3 is a circuit diagram illustrating sample pixel circuitry of two image sensor pixels within an image sensor, in accordance with an embodiment of the disclosure.

FIG. 3 is a circuit diagram illustrating pixel circuitry 300 of two four-transistor ("4T") pixels within an imaging array, in accordance with an embodiment of the invention. Pixel circuitry 300 is one possible pixel circuitry architecture for implementing each pixel within pixel array 205 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 3, pixels Pa and Pb are arranged in two rows and one column. The illustrated embodiment of each pixel circuitry 300 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 300 to the readout column line under control of a select signal SEL. In one embodiment, the TX signal, the RST signal, and the SEL signal are generated by control circuitry 220.

Figure 4A:
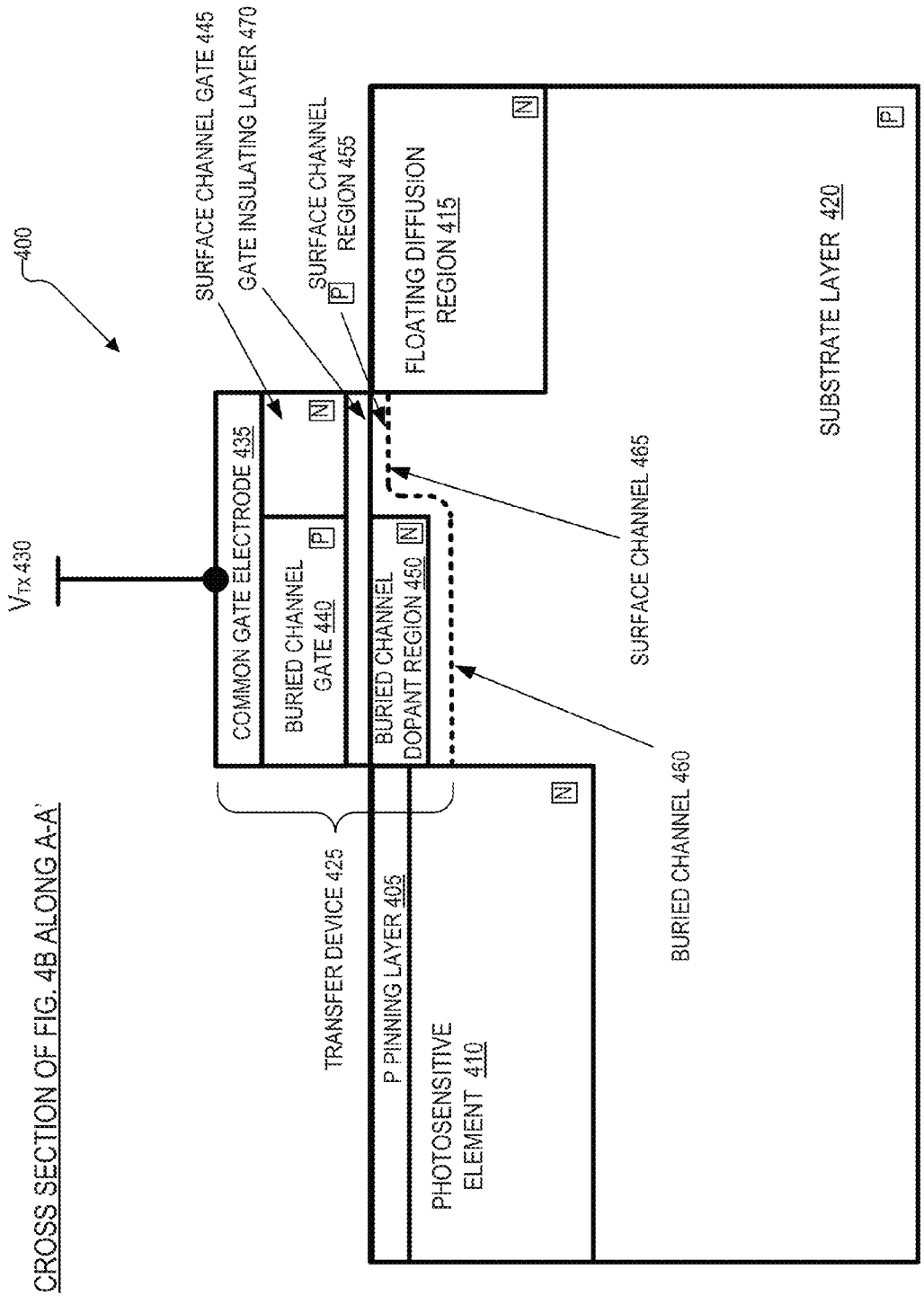
FIG. 4A is a cross sectional view along the A-A' line of FIG. 4B illustrating a portion of an image sensor pixel including a transfer device, in accordance with an embodiment of the disclosure.
Figure 4B:
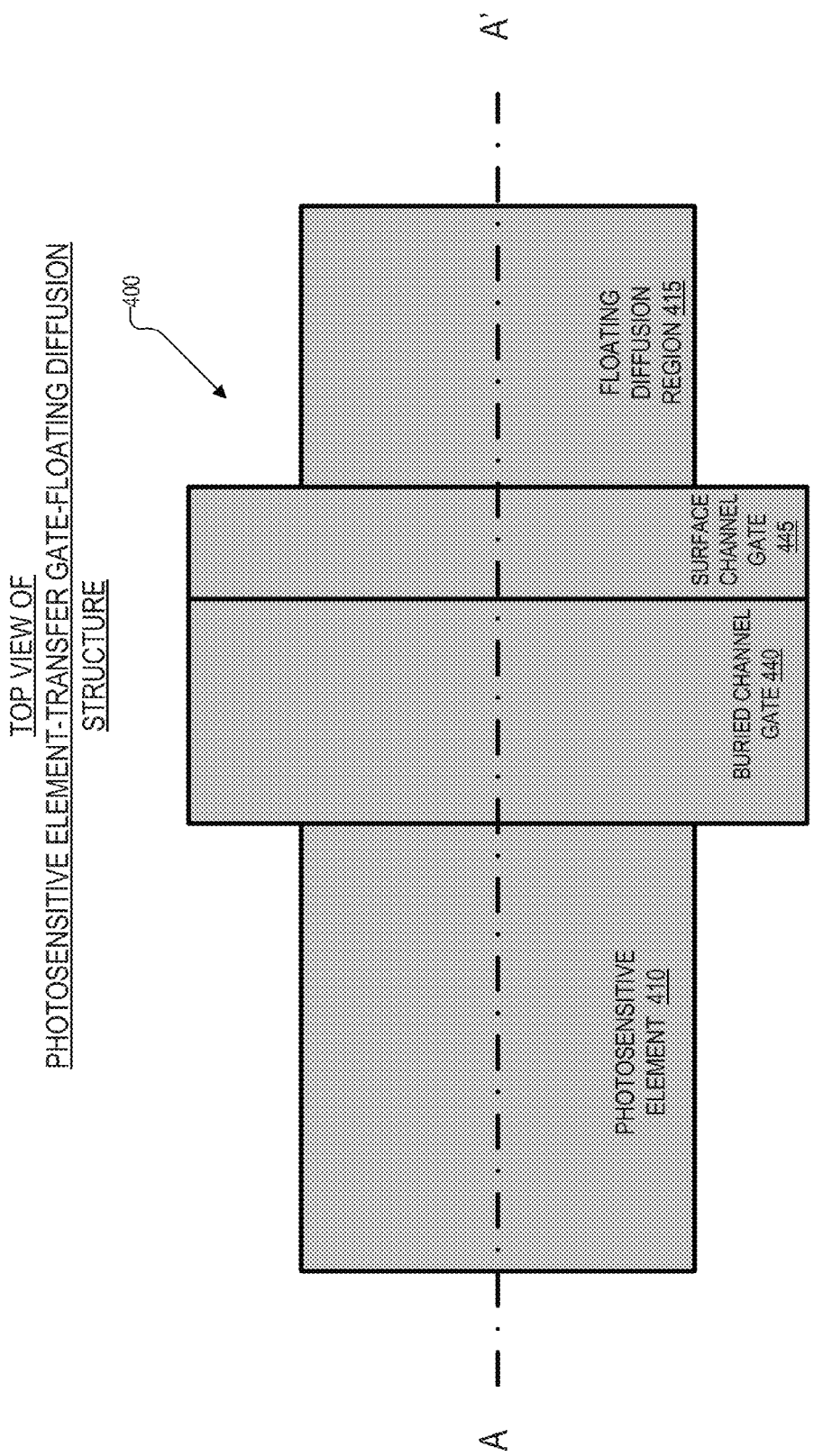
FIG. 4B is a top view of the structures of a photosensitive element, a transfer gate, and a floating diffusion region, in accordance with an embodiment of the disclosure.

FIG. 4A and FIG. 4B illustrate a portion of image pixel 400 including a transfer device 425, in accordance with an embodiment of the disclosure. FIG. 4B is a top view of image pixel 400 and FIG. A is a cross sectional view along the A-A' line of FIG. 4B. Image pixel 400 of FIG. 4A is one possible implementation of pixels P1 to Pn within pixel array 205. The illustrated embodiment of image pixel 400 includes a P pinning layer 405, a photosensitive element 410, a floating diffusion region 415, a substrate layer 420, and transfer device 425. Photosensitive element 410 and floating diffusion region are disposed within substrate layer 420. P pinning layer 405 is disposed above photosensitive element 410. Transfer device 425 is disposed between photosensitive element 410 and floating diffusion region 415.

The illustrated embodiment of transfer device 425 includes a common gate electrode 435, a buried channel gate 440, a surface channel gate 445, a buried channel dopant region 450, a surface channel region 455, and a gate insulating layer 470. Buried channel gate 440 and surface channel gate 445 both contact common gate electrode 435 and are both disposed between common gate electrode 435 and gate insulating layer 470. A $V_{TX}$ 430 may be applied to common gate electrode 435 for activating transfer device 425. In the illustrated embodiment, buried channel gate 440 is disposed above buried channel dopant region 450 forming a buried channel device. Surface channel gate 445 is disposed above surface channel region 455 forming a surface channel device. The buried channel device and the surface channel device are coupled in series between photosensitive element 410 and floating diffusion region 415. Buried channel dopant region 450 may be aligned under buried channel gate 440 and the left edge of buried channel dopant region 450 may be flush with the left edge of common gate electrode 435. Surface channel region 455 may be aligned under surface channel gate 445 and the right edge of surface channel region region 455 may be flush with the right edge of common gate electrode 435.

$V_{TX}$ 430 may reach a threshold voltage of transfer device 425, turning transfer device 425 on. When transfer device 425 is turned on, buried channel 460 and a surface channel 465 form in series, allowing charge carriers to flow between photosensitive element 410 and floating diffusion region 415. Buried channel 460 and surface channel 465 collectively make up the channel of transfer device 425.

In the illustrated embodiment, photosensitive element 410 and floating diffusion region 415 are N type doped, while the buried channel gate 440 is doped inversely (P type) from the N type dopant of photosensitive element 410 and floating diffusion region 415. Surface channel gate 445 and buried channel dopant region 450 are doped N type. Buried channel gate 440 and surface channel gate 445 may be doped polysilicon. In the illustrated embodiment, surface channel region 455 is P type doped. In alternative embodiments, surface channel region 455 maybe doped N type or not be doped at all. One of ordinary skill in the art will understand that the doping polarities in the illustrated embodiment may be reversed in alternative embodiments.

In the illustrated embodiment, buried channel dopant region 450 and photosensitive element 410 are both N type doped, making for easier transfer of electrons from the photodiode because the energy barrier for transfer is reduced. Buried channel dopant region 450 may mean transfer device 425 is referenced as a partial buried channel transfer gate. During the exposure period (transfer device 425 is off), the electrical charge accumulated by N type doped photosensitive element 410 may enter the N type doped buried channel dopant region 450 when photosensitive element 410 is full or approaching full capacity. In one example, electrons entering buried channel dopant region 450 may "punch through" to floating diffusion region 415. This feature of the illustrated embodiment encourages charge carriers from photosensitive element 410 to spill into floating diffusion region 415 rather than flowing to a photosensitive element of a neighboring pixel, causing blooming. By adjusting the ratio between the length of buried channel dopant region 450 and surface channel region 455, the blooming threshold can be tuned. For example, when surface channel region 455 is shortened, the barrier for excess charge to spill into floating diffusion region 415 is reduced, thereby further inhibiting blooming.

In the illustrated embodiment, buried channel dopant region 450 is doped opposite of the substrate. Consequently, when transfer device 425 is turned on, charge carriers are pushed below the surface (meaning below the intersection of gate insulating layer 470 and buried channel dopant region 450). Buried channel 460 illustrates charge carriers flowing beneath the surface. Charge carriers flowing beneath the surface may introduce less noise into an electrical signal because non-uniformities between the gate insulating layer (e.g. silicon-oxide) and the buried channel dopant region (e.g. N type doped silicon) are not encountered by the charge carriers.

In the illustrated embodiment, buried channel gate 440 is inversely doped in comparison to photosensitive element 410 and floating diffusion region 415. The inverse doping of buried channel gate 440 reduces gate depletion when the buried channel device is turned on because the P type poly silicon is driven into accumulation when the device turns on. The reduction of gate depletion decreases the threshold voltage and allows the charge carriers to flow with less resistance, thereby increasing the current capacity of the buried channel device. The increased current capacity and lower threshold voltage allow the charge accumulated in photosensitive element 410 to be transferred more completely and efficiently to floating diffusion region 415, resulting in decreased image lag or frame retention in image pixel 400. Furthermore, the lower threshold voltage resulting from buried channel gate 440 being inversely doped allows for a lower threshold voltage of transfer device 425. A low threshold voltage for transfer device 425 is desired to allow the available voltage level to have a larger (and quicker) effect transferring electrical signal from photosensitive element 410 to floating diffusion region 415. In one embodiment, the threshold voltage of transfer device 425 is between 0.5V and 0.9V.

Buried channel dopant region 450 alleviates manufacturing challenges related to forming conventional image pixel 100. Neck area 150 (FIG. 1) is the intersection of P pinning layer 110, photosensitive element 115, transfer gate 120, gate insulating layer 125, and substrate 135. The triangular nature of photosensitive element 115 in neck area 150 may present challenges in the exact placement of the tip of the triangle. For example, angled implants are required to overlap transfer gate 120 and photosensitive element 115. Angled implants are also required to underlap transfer gate 120 and P pinning layer 110. Additionally, neck area 150 may be susceptible to impurities and non-uniformities in manufacturing that alter the desired electrical effect. Furthermore, the triangular area of photosensitive element 115 in neck area 150 isolates a triangular portion of substrate 135, which creates an additional, unwanted PN junction. And, if photosensitive element 115 and transfer gate 120 are both N type, the N type doped photosensitive element 115 positioned so close to an N type transfer gate may generate dark current. In contrast, the rectangular nature of buried channel dopant region 450 does not create an unwanted PN junction and eliminates the multiple, elaborate steps associated with angled implants.

Figure 5:
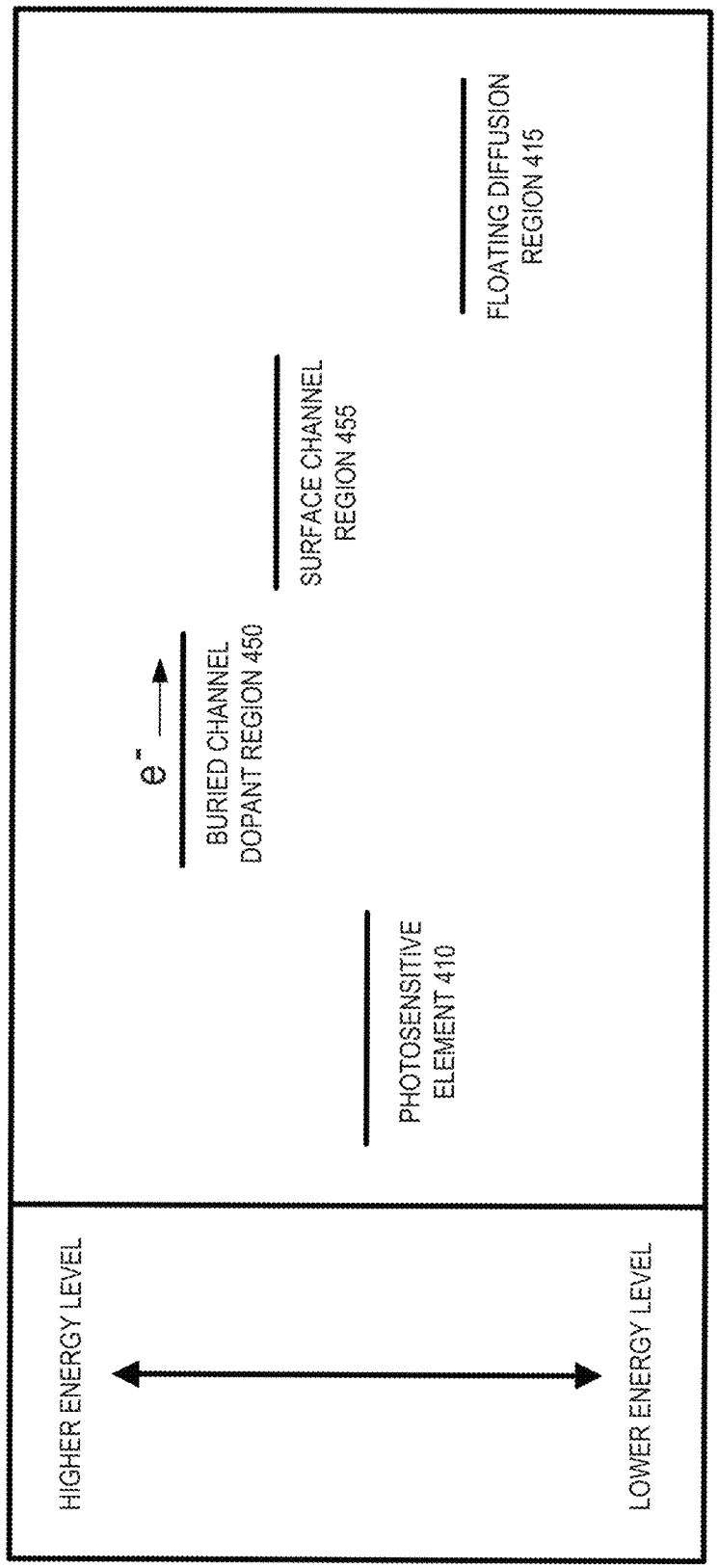
FIG. 5 is a chart illustrating a relationship between electrons and relative energy levels of structures, in accordance with an embodiment of the disclosure.

FIG. 5 is a chart illustrating a relationship between electrons and relative energy levels of structures, in accordance with an embodiment of the disclosure. FIG. 5 illustrates the relative energy levels that an electron may see in image pixel 400. Buried channel dopant region 450 has the highest energy level; surface channel region 455 has the second highest energy level; photosensitive element 410 has the third highest energy level; floating diffusion region 415 has the lowest relative energy level on the chart. When electrons are in buried channel dopant region 450, the energy levels of the structures illustrated in FIG. 4A encourage electrons to flow towards floating diffusion region 415 whether transfer gate 425 is on or off. When the transfer gate is off, N type buried channel dopant region 450 and P type buried channel gate 440 combined with P type surface channel region 455 causes electrons to flow toward floating diffusion region 415. When the transfer gate is turned on, the relative energy levels in FIG. 5 are maintained because the surface channel device has a lower threshold voltage than the buried channel device. The result is that any dark current generated under transfer device 425 is likely to drift toward floating diffusion region 415. This feature prevents white pixels from forming and reduces image lag by discouraging electrons from being sent back to photosensitive element 410 after a transfer event.

Figure 6:
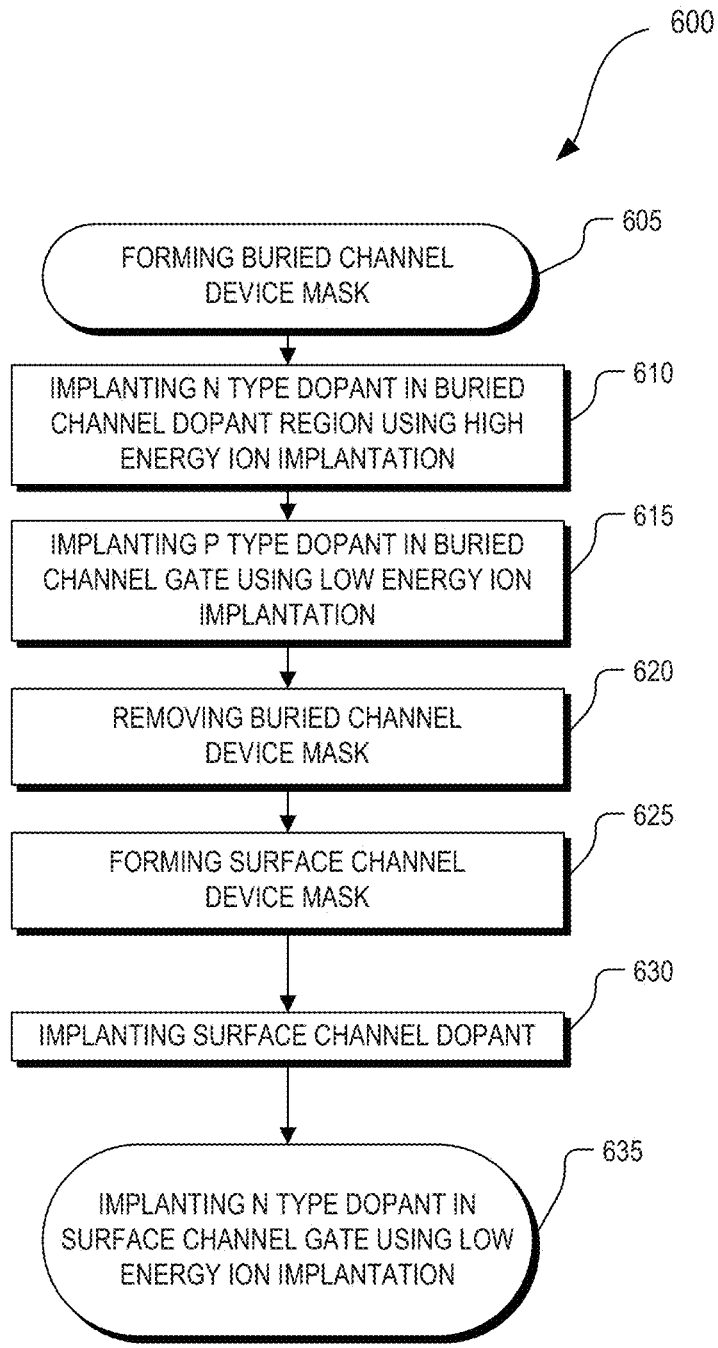
FIG. 6 is a flow chart illustrating a process for manufacturing a transfer device, in accordance with an embodiment of the disclosure.

FIG. 6 is a flow chart illustrating a process for manufacturing a transfer device, in accordance with an embodiment of the disclosure. Process 600 is one example of how to fabricate transfer device 425 of image pixel 400. The order in which some or all of the process blocks appear in each process should not be deemed limiting. Rather, one of ordinary skill in the art having the benefit of the present disclosure will understand that some of the process blocks may be executed in a variety of orders not illustrated, or even in parallel.

In process block 605, a buried channel device mask is formed on an existing structure. The buried channel device mask is patterned on the existing structure to isolate a region where the buried channel device will reside. An example of an existing structure may be a combination of P pinning layer 405, photosensitive element 410, floating diffusion region 415, substrate layer 420, buried channel gate 440, surface channel gate 445, buried channel dopant region 450, and surface channel region 455. However, at process block 605, buried channel gate 440, surface channel gate 445, buried channel dopant region 450, and surface channel region 455 may not yet contain the doping illustrated in FIG. 4. For example, buried channel gate 440 and surface channel gate 445 would be undoped polysilicon at process block 605.

At process block 610, an N type dopant (e.g. Arsenic or Phosphorus) may be implanted in buried channel dopant region 450 using high energy ion implantation. The energy level to implant the Phosphorous may be 150 kiloelectron-volts (keV). The dopant implantation dose of the Phosphorous may be $1\times10^{12}$ cm$^{-2}$. In one embodiment, the depth of the N type dopant in buried channel region 450 is 10-30 nm. The high energy ion beam passes through buried channel gate 440 on its way to implanting buried channel dopant region 450. In process block 615, a low energy ion beam (lower energy than 150 keV) implants P type dopant into buried channel gate 440. Since buried channel dopant region 450 and buried channel gate 440 can be doped with the same mask at the same step, manufacturing cost is reduced.

In process block 620, the buried channel device mask is removed. In process block 625, a surface channel device mask is formed. In process block 630, a surface channel dopant (P type dopant in the illustrated embodiment in FIG. 4A) is formed in surface channel region 455. In one embodiment, N type dopant (e.g. Arsenic) is implanted into surface channel gate 445 using low energy ion implantation (process block 635).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel, comprising:
   a photosensitive element disposed in a substrate layer for accumulating an image charge in response to light;
   a floating diffusion ("FD") region disposed in the substrate layer to receive the image charge from the photosensitive element; and
   a transfer device disposed between the photosensitive element and the FD region to selectively transfer the image charge from the photosensitive element to the FD region, the transfer device including:
      a buried channel device including a buried channel gate disposed over a buried channel dopant region; and
      a surface channel device in series with the buried channel device, the surface channel device including a surface channel gate disposed over a surface channel region, wherein the surface channel gate has the opposite doping polarity of the buried channel gate.

2. The image sensor pixel of claim 1, further comprising a common gate electrode and a common gate insulating layer, wherein the buried channel gate and the surface channel gate are disposed between the common gate electrode and the common gate insulating layer, and wherein the common gate electrode delivers a gate voltage common to the buried channel gate and the surface channel gate.

3. The image sensor pixel of claim 1, wherein the buried channel dopant region is adjacent to the photosensitive element and to the surface channel region.

4. The image sensor pixel of claim 3, wherein a ratio of a length of the buried channel dopant region and a length of the surface channel region is tuned to allow electrons from the photosensitive element to punch through to the FD region when the photosensitive element approaches full capacity and the transfer device is off.

5. The image sensor pixel of claim 3, wherein the buried channel dopant region is adjoining the photosensitive element, the buried channel dopant region is aligned under the buried channel gate, and an edge of the buried channel dopant region closest to the photosensitive element is flush with an edge of the common gate electrode.

6. The image sensor pixel of claim 1, wherein the buried channel gate has the opposite doping polarity of the photosensitive element and the FD region.

7. The image sensor pixel of claim 6, wherein the photosensitive element, the FD region, the buried channel dopant region, and the surface channel gate are N type doped, and wherein the buried channel gate is P type doped.

8. The image sensor pixel of claim 7, wherein the surface channel region is P type doped.

9. The image sensor pixel of claim 1, wherein the surface channel device has a lower threshold voltage than the buried channel device.

10. The image sensor pixel of claim 1, wherein a threshold voltage of the transfer device is between 0.5V and 0.9V.

11. An imaging system comprising:
   an array of imaging pixels wherein each imaging pixel includes:
      readout circuitry coupled to the array of imaging pixels to readout image data from each of the image sensor pixels;
      a photosensitive element disposed in a substrate layer for accumulating an image charge in response to light;
      a floating diffusion ("FD") region disposed in the substrate layer to receive the image charge from the photosensitive element; and
      a transfer device disposed between the photosensitive element and the FD region to selectively transfer the image charge from the photosensitive element to the FD region, the transfer device including:
         a buried channel device including a buried channel gate disposed over a buried channel dopant region; and
         a surface channel device adjacent to the buried channel device, the surface channel device including a surface channel gate disposed over a surface channel region, wherein the surface channel gate has the opposite dopant polarity of the buried channel gate.

12. The imaging system of claim 11, wherein the buried channel gate has the opposite doping polarity of the photosensitive element and the FD region.

13. The imaging system of claim 12, wherein the photosensitive element, the FD region, the buried channel dopant region, and the surface channel gate are N type doped, and wherein the buried channel gate is P type doped.

14. The imaging system of claim 11, wherein the buried channel device has a higher threshold voltage than the surface channel device.

15. The imaging system of claim 11, wherein the buried channel dopant region is adjacent to and adjoining the photosensitive element and a ratio of a length of the buried channel gate and the surface channel gate is tuned to optimize blooming and lag characteristics of the imaging pixel.

16. The image sensor pixel of claim 11, further comprising:
   a common gate electrode; and
   a common gate insulating layer, wherein the buried channel gate and the surface channel gate are disposed between the common gate electrode and the common gate insulating layer, and wherein the common gate electrode delivers a gate voltage common to the buried channel gate and the surface channel gate.

* * * * *